United States Patent [19]

Cochran et al.

[11] Patent Number: 4,832,789
[45] Date of Patent: May 23, 1989

[54] SEMICONDUCTOR DEVICES HAVING MULTI-LEVEL METAL INTERCONNECTS

[75] Inventors: William T. Cochran, New Tripoli; Agustin M. Garcia; Graham W. Hills, both of Allentown; Jenn L. Yeh, Macungie, all of Pa.

[73] Assignee: American Telephone and Telegraph Company, AT&T Bell Laboratories, Murray Hill, N.J.

[21] Appl. No.: 179,176

[22] Filed: Apr. 8, 1988

[51] Int. Cl.[4] .......................... B44C 1/22; C23F 1/02; C03C 15/00; C03C 25/06

[52] U.S. Cl. .................... 156/644; 156/653; 156/656; 156/657; 156/659.1; 357/71; 437/203; 437/228

[58] Field of Search ............. 156/644, 653, 656, 657, 156/659.1, 662; 357/65, 71; 437/180, 187, 189, 192, 194, 203, 204, 228, 245, 238, 241

[56] References Cited

U.S. PATENT DOCUMENTS 4,370,405 1/1983 O'Toole et al. ................... 430/312
4,605,470 8/1986 Gwozdz et al. .............. 156/659.1 X
4,631,806 12/1986 Poppert et al. .............. 156/659.1 X

OTHER PUBLICATIONS

A Planar Multi-Level Tungsten Interconnect Technology, D. C. Thomas and S. S. Wong, IEDM Technical Digest, pp. 811-813, Los Angeles, CA 1986.
Prairie-A New Planarization Technique and its Applications in VLSI Multilevel Interconnection, Andy L. Wu, Electrochemical Society Proceedings, 87-4, pp. 239-249, 1987.

Primary Examiner—William A. Powell
Attorney, Agent, or Firm—John T. Rehberg

[57] ABSTRACT

A self-assigned, self-planarized metallization scheme for multilevel interconnections using self-aligned windows in integrated circuits is described. Trenches are etched into a dielectric and then, using an etch stop layer on top of the dielectric to prevent unwanted etching of the dielectric, self-aligned windows which expose portions of the substrate are etched in the dielectric. Self-aligned windows can also be formed without a mask.

6 Claims, 2 Drawing Sheets

SEMICONDUCTOR DEVICES HAVING MULTI-LEVEL METAL INTERCONNECTS

TECHNICAL FIELD

This invention relates to semiconductor integrated circuits and to the metallization used in such circuits.

BACKGROUND OF THE INVENTION

As the complexity of integrated circuits increases, numerous approaches have been taken to solve the problem of expediently making electrical connections to and between individual devices. This is an important problem in integrated circuit fabrication because not only do electrical contacts and interconnections require space on the integrated circuit chip, but the complexity of the interconnections frequently requires the metallizations to be on more than one level. The former consideration requires minimization of the size of the metallization, and the latter consideration introduces processing complexity.

In a typical multilevel fabrication sequence, windows or vias are first opened in a dielectric layer to expose selected portions of the underlying substrate and then filled with a metal. Substrate is used to mean underlying material and thus may include the Si wafer, source and drain regions, prior interconnections, etc. Metal runners electrically connecting the filled windows are then formed on the dielectric. This is typically done by blanket depositing a metal and then patterning it. Of course, care must be taken to insure that the runners are properly aligned so that they contact the windows.

Although the processing sequence described is conceptually simple, at least three problems are likely to arise. (1) Metals are highly reflective and the optical printing and etching of features in metals is difficult and becomes even more so at submicron dimensions. (2) After the metal runners have been formed, a dielectric is deposited betwen the runners. This dielectric should be free of voids, but depositing such a layer becomes more difficult as runners are more closely spaced and the space available for the dielectric decreases. (3) Accurate pattern transfer from the mast is most easily obtained with a planar surface. As the topography becomes more complex, dielectric smoothing by means of flow or planarization may be required. However, reflow is not always an acceptable procedure since the temperature required for reflow may impair the integrity of lower metal levels. Planarization schemes make the processing more complex.

Some of these problems can be avoided by a technique such as that discussed by Thomas et al. in IEDM Technical Digest, pp, 811-813, Los Angeles, Calif., 1986. A composite dielectric layer, $Si_3N_4$ over $SiO_2$, is patterned to form trenches into which metal is selectively deposited with the nucleation being initiated by a silicon implant. Thus, the problems of filling the spaces between the runners and of obtaining a planar dielectric surface over complex topography are avoided.

Another approach, which also deposits a metal in a trench in a dielectric is described by Wu in Electrochemical Society Proceedings, 87-4, pp. 239-429, 1987. Exemplary sequences are shown in Wu's FIGS. 1 and 3. The first sequence forms the trenches, blanket deposits a metal, deposits and etches a photoresist thus leaving portions of the original trenches full of resist, etches back the metal to expose the dielectric surface using the resist as an etch mark, and strips the resist leaving recessed metal in the dielectric. The second sequence is conceptually somewhat similar although the unwanted metal is removed by a lift-off step.

Neither approach teaches how to make windows that are self-aligned.

SUMMARY OF THE INVENTION

We have found that metallizations including self-aligned contacts may be obtained by a method that we term "the reverse pillar process." The method deposits at least first and second dielectric layers and first and second etch stop layers between the first and second dielectric layers and on top of said second dielectric layer, respectively, patterns portions of said first dielectric layer and said etch stop layers to form trenches for metal runners. Portions of said trenches are now patterned, using the second etch layer to prevent unwanted etching of the dielectric, to form self-aligned windows in said first dielectric layer which expose selected portions of the underlying substrate. The first etch stop layer is typically a dielectric. The openings are now filled with metal.

Alternatives are contemplated. One dielectric layer, rather than two and an intermediate etch stop layer, may be used if the depth of the etch used for the first patterning step can be precisely controlled. In the preferred embodiment, however, a plurality of layers is used, typically 4, with the first etch stop layer being used to more precisely control the etch depths for windows and trenches. The method of the invention avoids patterning of a metal layer as the metal is deposited in trenches and windows. Also, the windows and metal trenches are filled simultaneously will metal thereby avoiding any interfaces.

In another embodiment, a maskless contact is obtained by depositing a metal after the first patterning step and etching back to leave metal sidewalls in the nailhead sections of trenches with the normal width portion of the trenches being sealed. The windows are then etched using the sidewalls as a mask, i.e., the metal acts as a mask as the bottom dielectric layer is selectively removed for the contact. Of course, the top dielectric is not etched because of the etch stop layer.

It will also be appreciated by those skilled in the art that the metal filling process is a self-planarizing process.

BRIEF DESCRIPTION OF THE DRAWING

FIGS. 2-5 are sectional views along line A—A' of FIG. 1 with

FIG. 2 showing the initial structure;

FIG. 3 showing the structure after etching for the metal pattern;

FIG. 4 showing the structure after etching the window pattern;

FIG. 5 showing the final structure; and

DETAILED DESCRIPTION

Figure 1:
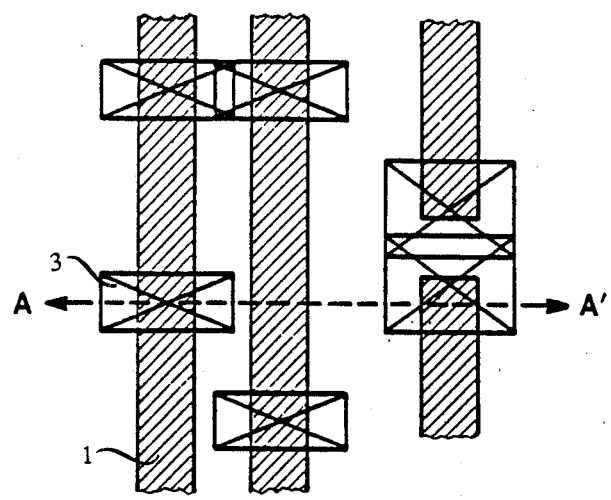
FIG. 1 is a top view of the layout and lithography for metallizations according to this invention.

FIG. 1 is a top view showing the layout and lithography for the metallizations according to this invention. The structure depicted comprises a plurality of metal runners indicated as 1 and a plurality of windows indicated as 3, opening to the underlying substrate. It will be readily appreciated that in a typical integrated circuit many more runners and contacts than those depicted will be present.

Figure 2:
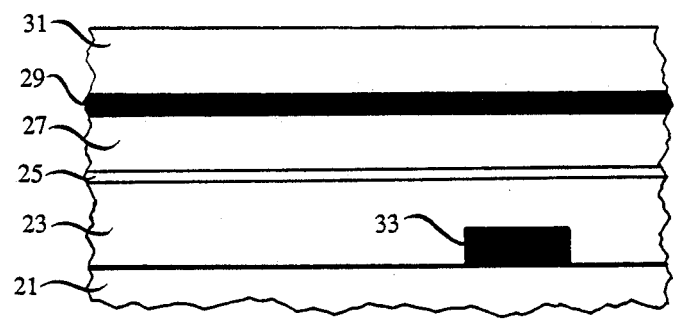

FIG. 2 depicts a cross section of the structure of FIG. 1 along line A—A'. Depicted are substrate 21, three dielectric layers 23, 25, 27, etch stop layer 29 and photoresist layer 31. Also shown is a conductive runner 33. The dielectrics have a total thickness $d_t$. Dielectric layer 23 has a thickness $c_t$ and layers 25 and 27 have a combined thickness $m_t$. Layer 25 is thin compared to layers 23 and 27. The term "substrate" is used to mean the materials underlying the dielectric layers. Choice of dielectric and etch stop materials will be apparent to those skilled in the art after reading the following description of the etching steps. Methods for depositing the dielectric and etch stop materials will be readily apparent to those skilled in the art.

Figure 3:
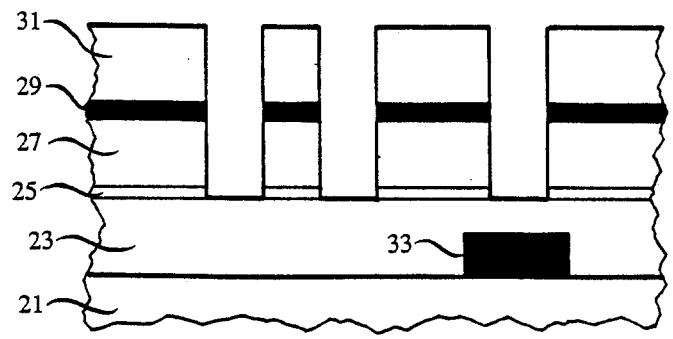

The photoresist 31 and etch stop layer 29 and the two top dielectric layers 25 and 27 are now patterned for the metal runners. This is done by patterning the photoresist with the desired metal pattern. It should be noted that the mask used is a mask of the reverse tone pattern. Well known techniques are used to etch the etch stop layer and both of the two top dielectric layers. The third, i.e., bottom, dielectric layer acts as an etch stop for the etch of the second, i.e., middle, dielectric layer. The resulting structure is depicted in FIG. 3.

Figure 4:
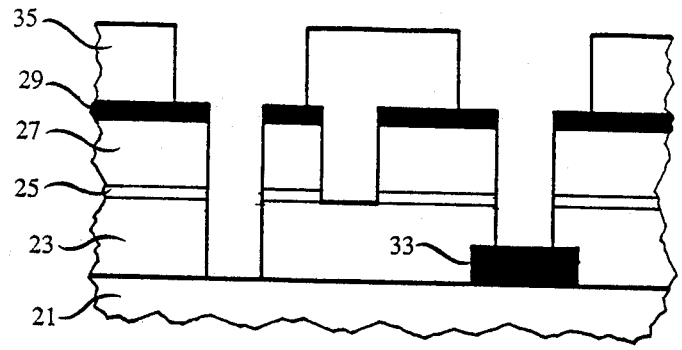

The photoresist for the reverse metal patterning is now stripped and a new layer of photoresist 35 is deposited and patterned with the window pattern. Standard lithographic techniques are now used to define the window pattern. It is noted that the windows, as defined in the resist, are oversized along the critical dimensions, and the etch stop layer 29 will provide self alignment during the subsequent window etch, i.e., layer 29 prevents etching of the underlying dielectric material thereby forming self-aligned windows. The dielectric 23 is etched to expose selected portions of the underlying substrate. Only portions that were exposed during the reverse metal etch will be etched to form electrical contacts. The resulting structure is depicted in FIG. 4. It is apparent that the etch stop layer, i.e. layer 29, stops the etching of the oversized portions of the window pattern as it is not etched by the process of etching the dielectric. However, as the reverse metal patterning exposed portions of dielectric layer 23, this layer is etched and portions of the substrate exposed.

Figure 5:
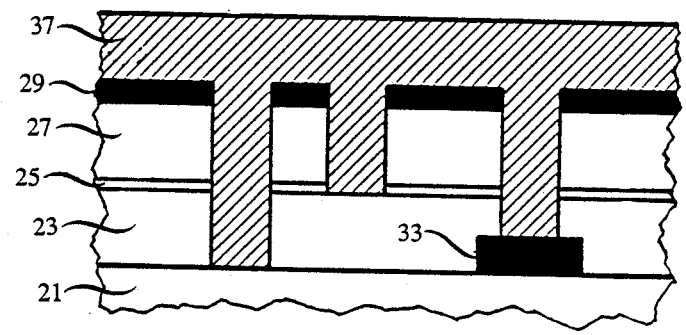

The contact photoresist is now removed, and conventional techniques used to fill the recessed areas with metal 37. The resulting structure is depicted in FIG. 5.

Several techniques can be used for depositing the metallizations. For example, sputtering can be used for aluminum metallization. Tungsten or other refractory metals may be deposited by either selective or blanket chemical vapor deposition. Selective deposition will result in the metal being present in only the trenches and windows after suitable activation of these areas. For the non-selective depositions, a uniform etchback will be required to remove material from the surface of the dielectric. The etch stop layer can be removed prior to or after the metal filling. If the etch stop is non-conductive, it does not have to be removed and can be used as an etch stop for the next level of metallization.

It will be readily appreciated that the process described may be repeated to obtain additional levels of interconnection.

The first and third dielectrics have an etch selectivity against the second dielectric and may be the same material. Both the etch stop layer 29 and the middle dielectric layer 25 have a high etch selectivity against layers 23 and 29, i.e., the first and second dielectrics. Layer 25 may thus also be referred to as an etch stop layer. The etch stop layers 25 and 29 are typically very thin with respect to the first and third dielectric layers. In the typical process described, the reverse metal pattern for the trenches is formed by etching the top etch stop layer and the top two dielectrics, that is, dielectrics 25 and 27. Typical dielectrics are oxides and nitrides. It will be appreciated that etching conditions will have to be changed for the two layers. Window patterning is performed, and dielectric 23 is etched to expose portions of the substrate for the windows. The metal is now deposited as previously described.

It will be appreciated by those skilled in the art that the reverse metal patterning is performed first and the window patterning performed second. This sequence is opposite to the conventional alignment sequences and produces a window which is self-aligned to the metal.

Variations in the process described are contemplated. For example, to avoid the necessity of using a plurality of dielectric layers, the depth of the etches into a single dielectric layer may be carefully controlled.

Figure 6:
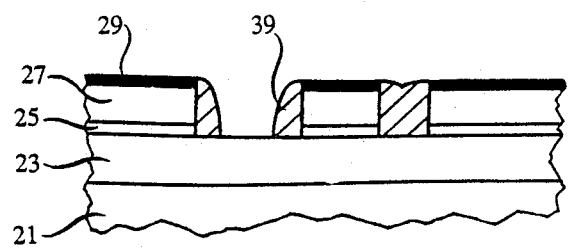
FIG. 6 depicts yet another embodiment which is a maskless contact.

A maskless window may be formed by blanket depositing a metal conformally after the first patterning step. The metal is then etched back so that only metal sidewalls 39 remain in the nailheads in the trenches where there are wider openings while the narrower runners 40 are sealed, i.e., filled, with metal. This structure is depicted in FIG. 6. Numerals identical to those used in describing previous figures represent identical elements. Techniques for appropriate deposition and etchback will be readily apparent to those skilled in the art. The sidewalls and the etch stop layer then act as a mask as the windows are opened in the bottom dielectric layer. Metal is then deposited and, if necessary, etched back to leave a planar surface. Although there is a reduction of one mask level per interconnection, self-aligned nailheads are required in this embodiment.

What is claimed is:

1. A method of fabricating a semiconductor integrated circuit comprising the step of fabricating a metallization on said circuit, said fabricating step comprises:
   depositing at least one dielectric layer and an etch stop layer on a substrate, said etch stop layer being over said at least one dielectric layer;
   patterning said etch stop and dielectric layer to form trenches for metal;
   patterning portions of said trenches in said at least one dielectric layer, said etch stop layer preventing etching of the underlying portions of said at least one dielectric layer thereby forming windows which expose portions of said substrate; and
   depositing metal to fill said trenches and windows.

2. A method as recited in claim 1 in which said second patterning step comprises patterning a resist on said etch stop layer to form oversized windows and etching said at least one dielectric layer, said windows in said layer being self-aligned.

3. A method as recited in claim 1 in which said second patterning step comprises depositing in metal in said trenches, etching back to form metal sidewalls in oversized trenches and etching said dielectric layer to form self-aligned windows.

4. A method as recited in claim 1 in which said at least one dielectric layer comprises first, second and third dielectric layers, said first and third layers having an etch selectivity against said second layer.

5. A method as recited in claim 4 in which said first and third layers comprise oxides.

6. A method as recited in claim 5 in which said second layer comprises a nitride.

* * * * *